United States Patent [19]

Advocate, Jr. et al.

[11] Patent Number: 5,904,156
[45] Date of Patent: May 18, 1999

[54] DRY FILM RESIST REMOVAL IN THE PRESENCE OF ELECTROPLATED C4'S

[75] Inventors: Gerald Gerard Advocate, Jr., Pleasant Valley; Lisa A. Fanti, Hopewell Junction, both of N.Y.; Henry Atkinson Nye, III, Brookfield, Conn.

[73] Assignee: International Business Machines Corporation, Armonk, N.Y.

[21] Appl. No.: 08/935,490

[22] Filed: Sep. 24, 1997

[51] Int. Cl.$^6$ ................................................. B08B 3/04
[52] U.S. Cl. .................... 134/2; 134/1; 134/1.3; 134/21; 134/37; 134/38; 134/40; 134/902; 438/745; 438/753
[58] Field of Search ..................... 134/1, 1.3, 2, 21, 134/37, 38, 40, 902; 438/745, 753

[56] References Cited

U.S. PATENT DOCUMENTS

| | | | |
|---|---|---|---|
| 3,799,179 | 3/1974 | Thomas | 134/95 |
| 3,869,313 | 3/1975 | Jones et al. | 134/73 |
| 4,431,685 | 2/1984 | Canestaro et al. | 427/89 |
| 4,861,425 | 8/1989 | Greer et al. | 156/644 |
| 5,000,795 | 3/1991 | Chung et al. | 134/37 |
| 5,013,366 | 5/1991 | Jackson et al. | 134/1 |
| 5,014,727 | 5/1991 | Aigo | 134/102 |
| 5,091,103 | 2/1992 | Dean et al. | 252/162 |
| 5,209,815 | 5/1993 | Fleming et al. | 156/629 |
| 5,240,878 | 8/1993 | Fitzsimmons et al. | 437/187 |
| 5,262,281 | 11/1993 | Bauer et al. | 430/323 |
| 5,316,591 | 5/1994 | Chao et al. | 134/34 |
| 5,450,290 | 9/1995 | Boyko et al. | 361/792 |
| 5,451,267 | 9/1995 | Stadler et al. | 134/30 |
| 5,492,235 | 2/1996 | Crafts et al. | 216/13 |
| 5,541,135 | 7/1996 | Pfeifer et al. | 437/60 |
| 5,690,747 | 11/1997 | Doscher | 134/1 |

Primary Examiner—Arlen Soderquist
Assistant Examiner—S. Carrillo
Attorney, Agent, or Firm—Ratner & Prestia; Ira D. Blecker

[57] ABSTRACT

A process for wet chemically stripping dry, thick film photoresists in semiconductor applications. This process includes contacting the silicon wafer with a stripping solution and agitating the solution. The process may be performed in a strip tank having a chemical stripping solution, and nitrogen or other inert gases may be provided through a pressurized tube to cause bubbling in the solution and to strip the wafer.

9 Claims, 7 Drawing Sheets

DRY FILM RESIST REMOVAL IN THE PRESENCE OF ELECTROPLATED C4'S

FIELD OF THE INVENTION

The present invention relates to wet chemical stripping of thick film photoresists for semiconductor applications. In particular, it describes a wet chemical formulation and process, along with a specialized agitation mechanism, for the non-invasive stripping of thick film photoresist in the presence of electroplated C4 solder bumps. This process has been shown to successfully remove all traces of the photoresist without redeposition of the resist or excessive corrosion of critical device elements.

BACKGROUND OF THE INVENTION

Integrated circuit technology utilizes photoresist compositions which generally comprise a polymeric resin or binder compound, a radiation sensitive compound, and a suitable solvent to enable forming a film of the composition over a particular substrate for photolithographically delineating patterns on such substrate. In a typical processing scheme, the photoresist compositions are spun on or applied to the substrate with different methods known in the art. Then the photoresist compositions may be subjected to a pre-exposure bake to drive off a proportion of the solvent and impart dimensional stability to the film. The coated substrate is exposed with actinic radiation, usually in the UV, electron-beam, or x-ray spectra, using an appropriate tool for such exposure. After exposure, the coated substrate undergoes a development process where, due to selective dissolution of certain areas, a pattern is formed or developed. In certain areas of the photoresist film, the resist material is completely removed while in other areas the remaining photoresist forms a pattern having a desired or intended configuration. Such patterns are used to mask or protect the substrate for subsequent wet or dry etching processes, the deposit of conductor or insulator patterns, or for incorporation of the patterned photoresist into the device or package as, for example, an insulating or passivating layer.

The remaining resist material may be further exposed to dry or wet etching. Such treatment serves to define or transfer the pattern and to enable further processing such as the deposition of dielectric or metallic film to be patterned by, for example, a lift-off or polishing step later in the process sequence. Before this etching process, the photoresist materials may be treated with a blanket exposure, with deep UV radiation, at very high temperatures. This treatment improves the resist selectivity and provides better etching and dimensional controls.

It is necessary in comprehensive lithographic processes that the photoresist material, following pattern delineation, be evenly and completely removed in certain areas, in order to meet downstream process and product objectives. Any portion of photoresist remaining in a region of desired removal for such processing may cause deleterious results. Photoresist residues can lead to defects which are detrimental to yield.

Controlled Collapse Chip Connection (C4) is an advanced microelectronic chip packaging and connection technology. C4 is also known as "solder bump" and "flip chip." The basic idea of C4 is to connect chips, chip packages, or such other units by means of solder balls between two surfaces of the units. These tiny balls of electrically conductive solder bridge the gaps between respective pairs of metal pads on the units being connected. Each pad has a corresponding pad on the surface of the other unit so that the pad arrangements are mirror images. As the units are aligned and exposed to temperatures above the melting point of the solder, the solder balls on the pads of the first unit become molten and join to corresponding conductive pads (having no balls) on the second unit, partially collapsing the solder balls and making connections between respective pads.

In C4, the solder balls typically are formed directly on the metal pads of the one surface. The bumps are electrically isolated from each other by the insulating material that surrounds each ball. The substrate might be un-doped silicon (Si) or some other material. The bottom of the ball is electrically connected to the chip circuit. When the balls are aligned to metal pads on a second surface and reflowed, the liquid solder bumps wet the receiving pads. Upon cooling, relatively low-stress solder joints are formed. This process allows all of the connections to be made in one step, even with slight variations in the surfaces.

A major application of C4 is in joining semiconductor microchips (integrated circuits) to chip packages. Chips may be made in rectangular arrays on a mono-crystalline slab of silicon, called a "wafer," which is a thin disc typically several inches across. Many chips may be formed on each wafer, then the wafer is diced into individual chips and the chips are "packaged" in units large enough to be handled. The C4 balls are placed on the chips while they are still in wafer form.

The wafers may be made as large as possible so as to reduce the number of wafers that must be processed to make a certain number of chips. For the same reason (among others), the chips may be made as small as possible. Thus, the best C4 fabrication system is one that can make thousands of very small, closely spaced solder balls each precisely placed over a large area.

C4 allows a very high density of electrical interconnections. Unlike earlier techniques which made connections around the perimeter of a chip or a chip package, C4 allows one or more surfaces of a chip or package to be packed with pads. The number of possible connections with C4 is roughly the square of the number that is possible with perimeter connection. Because the C4 balls can be made quite small, less than a hundredth of an inch in diameter, the surface density of C4 connections can be on the order of thousands per square inch.

To improve performance and reduce cost, electrical engineers are constantly placing more and more circuits onto each chip. As the number of circuits on a chip grows, so does the number of connections needed. C4, which allows more connections in a small space than any other technique, is therefore commercially important.

In addition to making possible area connection, C4 can also be used with perimeter connection techniques such as tape automated bonding (TAB). In TAB, solder balls on a chip are pressed against a pattern of metal foil adhered on a plastic substrate of the chip package. TAB-related applications, also, are commercially important.

C4 solder bumps must be mechanically well-fastened to their pads, or they may fail during the thermal stressing that is characteristic of routine device operation. It will be appreciated that a complex device such as a computer may have dozens of chips and hundreds or thousands of C4 solder ball connections. The entire device may be rendered useless if only one of the balls fails. Thus, the attachment of the C4 balls requires careful design.

A typical C4 structure consists of a solder bump (or pad) resting on a silicon device, interposed by a metal stack known as the ball limiting metallurgy (BLM). Solder bumps are most commonly (although not exclusively) comprised of lead/tin alloys. A variety of metal combinations are used for the BLM with one of the most common being Cr/Cu/Au. One highly utilized method for fabricating C4's involves evaporating solder through a metal (such as molybdenum) mask. A second alternative method involves electrodepositing solder through a photomask.

During C4 fabrication by electroplating, an integral part of the process sequence is the successful removal of the photoresist used to define the C4 features.

A wide variety of resist materials, for a wide variety of applications, have been removed by one or more of the following: halogenated hydrocarbons, such as methylene chloride or tetrachloroethylene; amines and their derivatives, such as dimethylformamide, N-methyl-2-pyrrolidone; glycol ethers such as ethylene glycol monomethyl ether, ethanol, and the acetates thereof; ketones such as methyl ethyl ketone and acetone; and materials such as isopropyl alcohol, sulfuric acid, ammonium persulfate, dioxane, aqueous hydroxides, and mixtures of caustic and phenol derivatives as well as various other materials. These various agents suffer one or more disadvantages, such as potential toxicity to workers exposed to such materials, environmental and pollution problems after use, volatility, corrosion of equipment, and the safety hazards inherent in operating at temperatures above the flash point of the stripper. Additionally, as the ground rules on semiconductor devices and packaging call for an even greater degree of integration, the presence of even traces of resist materials has become less tolerable. Therefore, processing with strippers heretofore known has involved metal attack, attack of the silicon substrate itself, or both. The presence of water, high temperatures (>100° C.), or both exacerbates such attacks.

Processing conditions for resists such as high temperature bakes, the use of techniques such as ion implantation (e.g., boron ion implantation and the like), and deep ultraviolet radiation hardening lead to highly crosslinked resists which are extremely resistant to dissolution in most organic solvent strippers conventionally used in the art. Particularly tenacious compositions containing phenolic or chlorinated hydrocarbon solvents have been used at elevated temperatures to strip such resists. Such extreme measures are clearly undesirable because they involve considerable hazard to technicians carrying out the stripping and present potential pollution and environmental problems in the disposal of the resulting waste products. These chlorinated solvent-containing compositions are particularly sensitive to the presence of water which forces the equilibrium to shift to a higher chloride ion concentration in solution which causes metal attack. Aqueous solutions of strong bases have the deleterious side effect of exhibiting aggressive metal attack as well as having an etchant effect on silicon substrates and the like.

The art is replete with attempts to provide improved stripper compositions which have been designed to meet the deficiencies that their inventors perceived. Among the solutions are included the following:

U.S. Pat. No. 4,744,834 is directed to compositions useful for removing photoresist from substrates comprising 10–90% of a 2-pyrrolidone which may be N-alkyl or N-hydroxyalkyl substituted where the alkyl portion has 1–3 carbons; 10–30% of diethylene glycol monoalkyl ether where the alkyl group has 1–4 carbons; 1–10% of a polyglycol having a molecular weight from about 200–600; and 0.5 . 4% of a quaternary ammonium hydroxide of the form $NR_3R_4R_5R_6$ where patterns $R_3$ and $R_4$ are the same or different alkyl groups of 1–4 carbon atoms, $R_5$ is an alkyl group of 1–18 carbon atoms, and $R_6$ is an alkyl group of 1–18 carbon atoms, phenyl, benzyl, alkylphenyl, or alkylbenzyl where the alkyl portion has 1–18 carbons. The compositions of this reference were shown to be useful in the removal of photoresist which was hard baked at 125° C. (a range of 120–300° C. is given) by use of the stripping solution at 90° C.

U.S. Pat. Nos. 4,395,479, 4,401,748, and 4,428,871 are directed to 2-pyrrolidone based stripping compositions which include a tetrahydrothiophene-1,1-dioxide, a tetrahydrofuran, or a diethylene glycol monoalkyl ether, respectively, to provide improved stripping results. These compositions may also preferably include propylene glycol and a diethylene glycol monoalkyl ether in the case of the first two compositions.

U.S. Pat. No. 4,765,844 is directed to resist stripper compositions comprising 10–100% of a difunctional water-soluble amino derivative which is either a diamino or an amino hydroxy compound and 0–90% of a propylene glycol derivative.

U.S. Pat. No. 4,776,892 discloses processes for removing photoresist compositions from a substrate including the use of an aqueous solution containing an organic quaternary ammonium base, preferably tetramethylammonium hydroxide (TMAH). The solutions may also contain a strong inorganic base. The stripping is generally conducted at an elevated temperature of 30–70° C.

U.S. Pat. No. 3,673,099 is directed to resist stripping compositions and processes which provide a composition comprising a mixture of N-methyl-2-pyrrolidone (NMP), and a strong base such as an alkyl or substituted alkyl ammonium hydroxide. Miscible organic solvents such as ethylene glycol monomethyl ether may also be included. The method is practiced at from 25° C. to the boiling point of the stripping composition.

U.S. Pat. No. 3,706,691 is directed to solvents to dissolve potting (encapsulating) compositions having bonds susceptible of hydrolytic cleavage (e.g., polyamides, polyesters, and polyester-base type polyurethanes) which comprise benzyltrimethylammonium hydroxide and a constituent selected from the group of (a) tetrahydrofuran and acetone, (b) methylene chloride, (c) methylene chloride and acetone, and (d) N-methyl-2-pyrrolidone.

U.S. Pat. No. 4,239,661 discloses aqueous stripping solutions containing 0.01–20% by weight of trialkyl(hydroxyalkyl) ammonium hydroxide (THAH) where the alkyl groups have 1–4 carbons and the alkylene portion of the hydroxyalkyl has 2–4 carbons. The THAH solution is very basic and dissolves alkali metals and aluminum and etches silicon oxide.

U.S. Pat. No. 4,617,251 is directed to a stripping composition that is indicated to be free of phenol compounds and of halogenated hydrocarbon compounds because of the toxicity and disposal problems that accompany such materials. The stripper compositions comprise an amine and an organic polar solvent with a boiling point greater than 140° C.

PCT publication WO 88/05813 (based on application number PCT/US87/02291) discloses photoresist stripper compositions comprising a mixture of (a) pyrrolidone, N-substituted pyrrolidone, butyrolactone, or caprolactone and (b) about 2–10% by weight of a tetraalkylammonium hydroxide or a trialkylaralkylammonium hydroxide. The ratio of the component from (a) to the component from (b)

is from 50:1 to 4:1. Optional ingredients include surfactants and diluents which may include polar organic solvents such as glycols, e.g., ethylene glycol, propylene glycol, dipropylene glycol, tripropylene glycol, tetrapropylene glycol, and the like.

U.S. Pat. No. 5,209,815 discloses a method of forming a patterned film onto a substrate including a step of stripping the photoresist layer. The disclosed photoresist stripper compositions comprise a mixture of N-methyl-2-pyrrolidone (NMP); 1,2-propanediol; and tetraalkylammonium hydroxide. Various percentage combinations of these three ingredients are also disclosed.

The present invention addresses stripping of dry, thick film photoresists which are used to create photo images during the fabrication of C4's by electroplating. The use of dry, thick film photoresist for wafer applications is somewhat unconventional. Dry, thick film photoresist is durable, highly cross-linked, and is not easily solvated by simple strippers such as dilute aqueous hydroxides. In addition, these resists often contain bonding agents which promote strong adhesion between the resist and metal (such as copper) surfaces. This high level of adhesion is required to maintain tight tolerances on photo image sizes and to ensure that the photo mask will not delaminate in the somewhat harsh environment of an electroplating bath. The tenacious character of this class of resists provides many advantages, but this must be overcome during the stripping process.

Although aqueous hydroxides do not solvate certain thick film photoresists, they are the conventional means by which to remove them. Under aggressive enough process conditions, the hydroxide radical chemically attacks the metal/photoresist interface, causing pieces of the resist to slough off in sheets. For panel and board applications, where feature dimensions are in the 10–20 mil (mil=0.001 inches) (0.0254–0.0508 millimeters (mm)) range, acceptable results can be achieved by heating a 1–10 wt % solution of aqueous hydroxide to above approximately 50° C., and dispensing it through a series of high-pressure nozzles in a conveyerized arrangement. Extensive filtering schemes are used whenever chemicals are recycled, in order to minimize redeposition of resist chunks on the workpiece surface.

The above approach is unacceptable for removing dry, thick film photoresists used in C4 fabrication processes for a number of reasons. First, silicon wafers are extremely fragile and cannot withstand such aggressive handling. Second, the physical geometry of the plated C4 structures tends to retain the resist around the base of the pads. Photo processing for C4 plating applications must be performed at relatively high aspect ratios of approximately 1:1, which makes it difficult to fabricate completely vertical sidewalls. As a result, a typical C4 photo image contains a slight foot at the bottom, which is inclined to mechanically retain unsolvated resist. Third, the close proximity of the C4 pads within a chipsite can inhibit the stripping process. The spacing between adjacent pads is often less than 5 mils (0.127 mm), which makes it difficult to transport large chunks of resist away from the workpiece surface without entangling them on the C4's.

In addition to all of the above considerations, the chemical compatibility of the stripper with plated C4 devices is a serious concern. During the resist stripping process, several vulnerable materials are exposed, including lead/tin solder, copper, polyimide, and bare silicon. Aqueous hydroxides, as well as a multitude of other commercially available strippers, are corrosive to the above constituents, particularly at elevated temperatures.

For C4 plating applications, established stripping methods such as conveyerized high pressure hot hydroxide sprays are not suitable. As shown in FIG. 5, use of hydroxide 32 as a spray from a nozzle 30 on a plated C4 24 to remove thick film photoresist 22 is likely to leave chunks of sloughed resist 28 as a residual which may redeposit. The thick film photoresist 22 is not soluble enough in the hydroxide 32 to be completely removed even when sprayed, without excessive destruction of device constituents.

FIG. 6 displays the typical results of an attempted hydroxide removal of dry film photoresist in the presence of C4's. Insoluble sloughed resist 28 has been redeposited on C4 solder bumps 24. These chunks of sloughed resist 28 embody the transport limitations which exist near the surface of the wafer 2.

In addition, as shown in FIG. 8, these aqueous hydroxides 32 or other harsh strippers attack and break down the C4 24 and silicon wafer 2, cause delamination of the polyimide 40, attack copper, and leave residual photoresist 34. Thus, these hydroxides 32 are not compatible with fragile silicon wafers or corrodible features and are not useful for most C4 applications.

Finally, as discussed above, several other established chemistries for stripping tough resists do exist, such as those containing methylene chloride or glycol ethers. They pose serious safety and environmental threats, however, which make them less desirable. Thus, there is a need for a safe, robust, and non-corrosive process for completely removing thick film photoresist from the vicinity of electroplated C4 pads.

SUMMARY OF THE INVENTION

To achieve these and other objects, and in view of its purposes, the present invention provides a process for removing thick film photoresists utilizing a chemical formulation, an agitation scheme, and other process elements which enable the successful stripping of devices in the presence of solder, thin copper, polyimide, and bare silicon. This process also works with other applications which involve both dry, thick film photoresists and highly corrodible features.

A preferred embodiment of the present invention includes a process for removing thick film photoresist using a chemical formulation and an inert gas fan agitation scheme within an apparatus which supplies an inert gas into a strip tank of solution through an inert gas fan. The fan is pressurized and has pinholes in the tube which allow the inert gas to be instilled in and to cause bubbling in the stripping solution. Another preferred embodiment of the present invention includes a process in which nitrogen is the inert gas.

DETAILED DESCRIPTION OF THE INVENTION

The process of the present invention can strip a dry, thick film photoresist in the presence of electroplated C4 solder bumps. The process delivers resist-free chips, with no polyimide delamination, no visible silicon etching, and lead/tin losses of less than 5% by weight.

Figure 3:
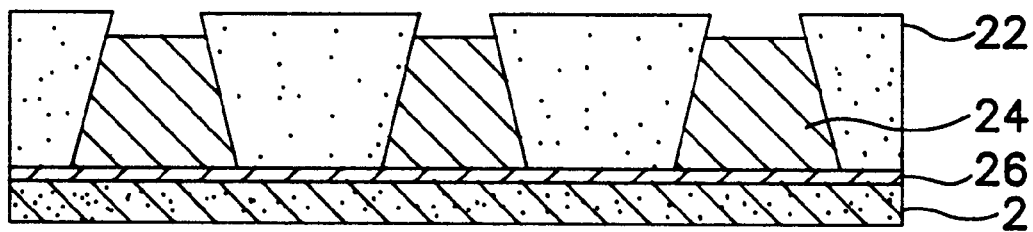
FIG. 3 is a side view of the electroplated C4 with photoresist on the conductive metal stack or seed layer.

A preferred embodiment for C4 fabrication by electroplating is shown in FIG. 3. A blanket stack of metal 26 is deposited on a functional silicon wafer 2. The metal stack 26 serves both as a conductive seed layer for the electrodeposition of solder, and as the basis for the final BLM structure. After metal deposition, the wafer 2 is heat laminated with a several mil thick layer of dry film photoresist 22, and photo-imaged to define circular features several mils in diameter. To fabricate the actual C4's 24, the patterned wafer is immersed in a solder plating bath and electroplated to form numerous cylindrical pads, several mils high. Following solder deposition, the resist 22 is removed and the metal stack 26 is sub-etched to electrically isolate the interconnects and form the BLM.

Figure 4:
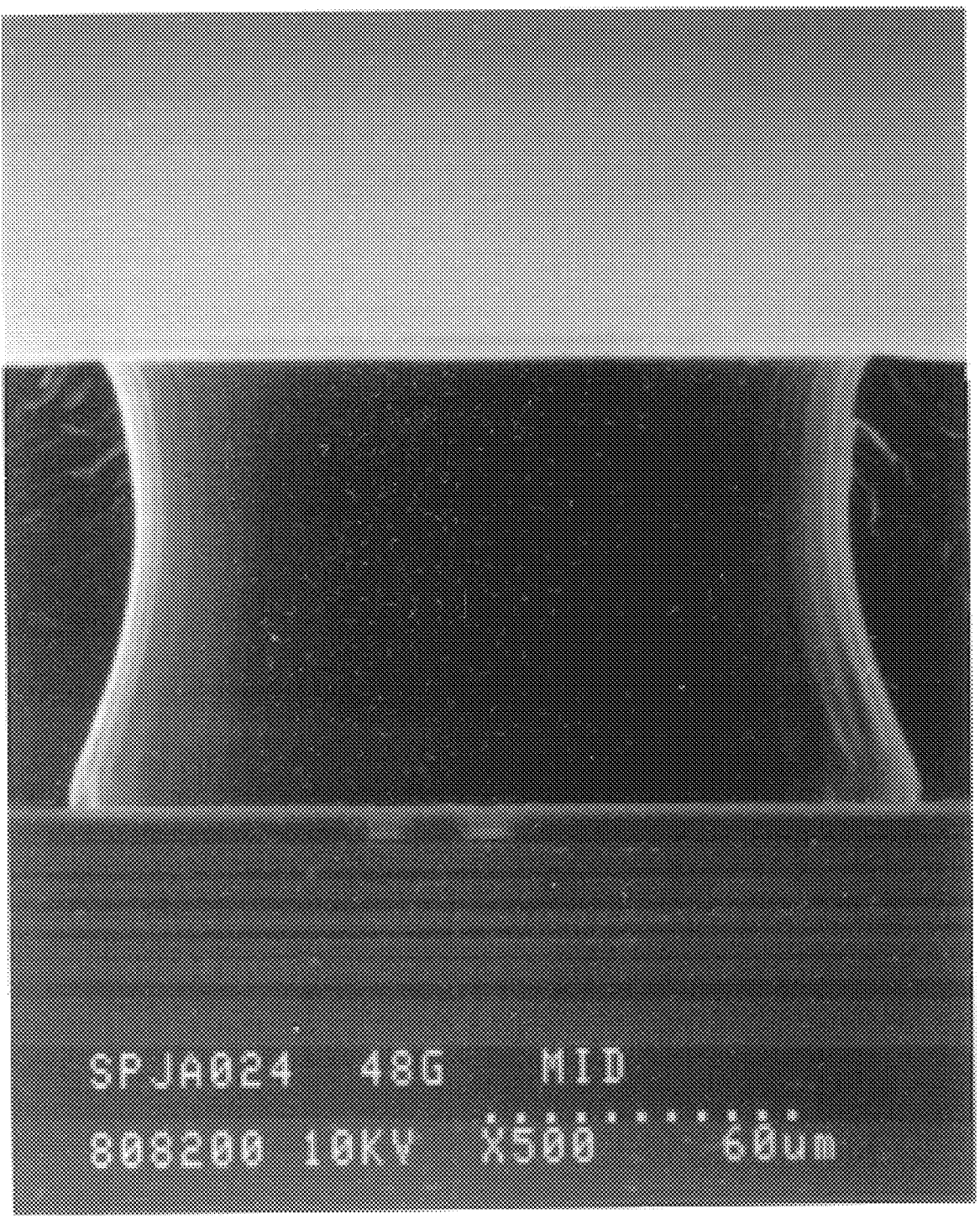
FIG. 4 is an image of the geometry of Riston photo imaging for C4 plating applications.
Figure 5:
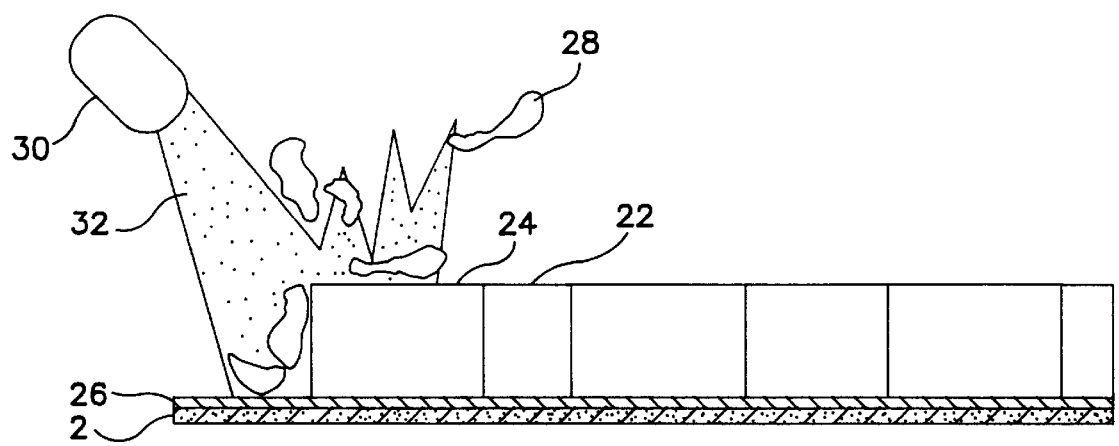
FIG. 5 is a side view of a conventional method of removing photoresist from C4 with aqueous hydroxides.
Figure 6:
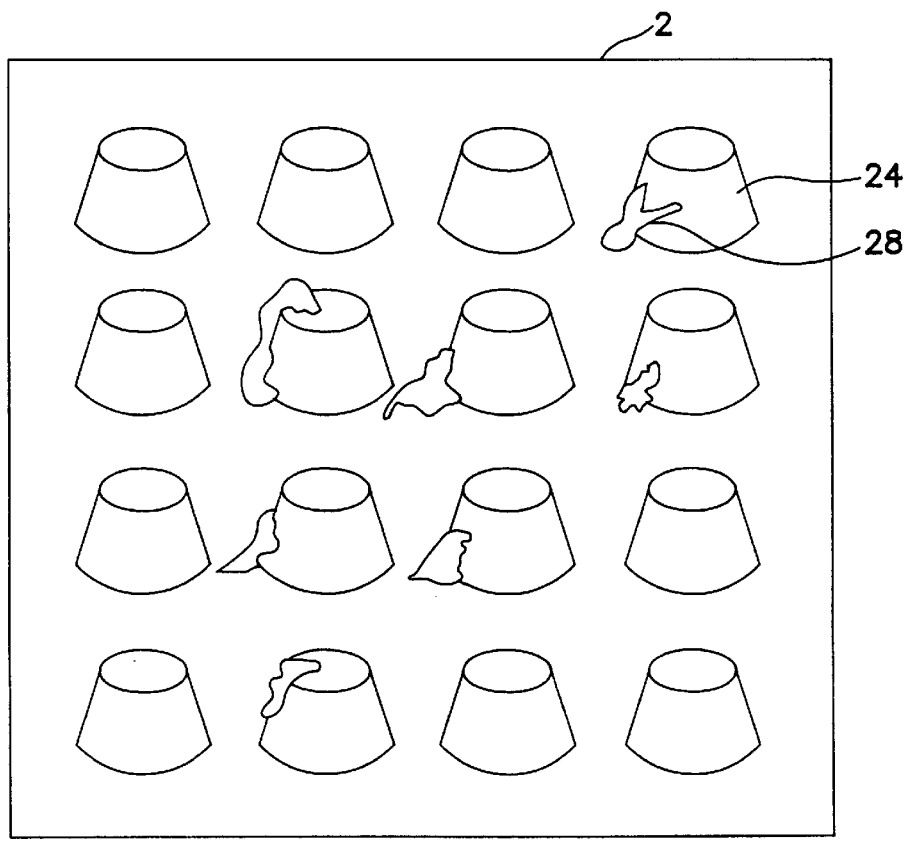
FIG. 6 is a perspective view of C4's on which chunks of photoresist have redeposited.

A particularly preferred embodiment of the present invention uses Riston 4800 series photoresist from DuPont which consists of 60–100% benzophenone, 5–10% 4-methyl-4-trichloromethyl-2,5-cyclohexadien-1-one, 1–5% ethyl 4-(dimethylamino) benzoate, 1–5% tetramethyl succinonitrile, 1–5% methyl alcohol, and less than 0.1% polyol acrylate monomer. The BLM of the C4 used may be a tri-layer stack of TiW, CrCu, and Cu. FIG. 4 shows the geometry of Riston photo imaging for C4 plating applications. The re-entrant sidewall at the base of the image has a tendency to mechanically retain resist, making stripping difficult.

In this embodiment, it was demonstrated that complete resist removal is difficult to obtain using the vendor recommended stripping chemistry which consists of aqueous hydroxides. Initial studies were performed in a stagnant, batch mode, in which a rack or boat of wafers was submerged in a tank of chemicals. Wafers were stripped at a variety of potassium hydroxide concentrations, temperatures, and times, with marginal results. Under these conditions, complete resist removal was rarely achieved. Although rather large resist flakes would slough off between chips, and somewhat between pads, smaller fragments were almost always retained at the base of the pads. For the majority of products, other deleterious effects including polyimide delamination, silicon etching, copper oxidation, and excessive solder-etching were commonplace. In addition, redeposited resist flakes were frequently observed when multiple wafers were stripped in the same tank.

Unsatisfactory results have also been demonstrated using the above-mentioned chemistry in a spin-spray configuration, in an effort to mechanically dislodge the resist from the base of the pads. Although results were improved over the stagnant arrangement, the temperatures and times required to completely remove the resist were such that device constituents were harmed. In order to facilitate the decomposition of the Riston photoresist into smaller pieces, varying concentrations of monoethanolamine were added to the hydroxide solutions. Additional improvement was observed, but the above-mentioned defects were still prevalent. Thus, it has been demonstrated that the sloughing mechanism by which aqueous hydroxides attack and remove the dry, thick film photoresist is unsuitable for many C4 plating applications.

The present invention uses a more suitable approach, including a strip chemistry that solvates the resist without degrading solder, polyimide, and silicon. To this end, an organic stripper consisting of 70–80% by weight N-methyl-2-pyrrolidone (NMP), 20–30% by weight propane diol, and 25–35 g/l of tetramethyl ammonium hydroxide has proven successful. This formulation was originally developed by Dean et al. (U.S. Pat. No. 5,091,103), for the purpose of removing highly baked Novolak resists from semiconductor devices, without secondary harmful effects.

When the above-mentioned chemical formulation is used in batch mode, at temperatures between 50° C. and 75° C. for between 60 and 180 minutes, the mechanism for stripping is entirely different from the sloughing mode that is characteristic of aqueous hydroxides. Instead, the NMP swells the resist, while the propane diol and the tetramethyl ammonium hydroxide attack the chemical bonds both within the resist and at the resist/copper interface. As a result of this dissolution effect, wafers processed at approximately 60° C. for 120 minutes are relatively resist-free.

The stripper has also been shown to be extremely compatible with C4 solder pads and other device constituents. The polyimide shows no visual signs of delamination, the lead/tin solder corrosion (as calculated by weight loss) is minimal, and the copper and silicon show no visible signs of etching.

Figure 7A:
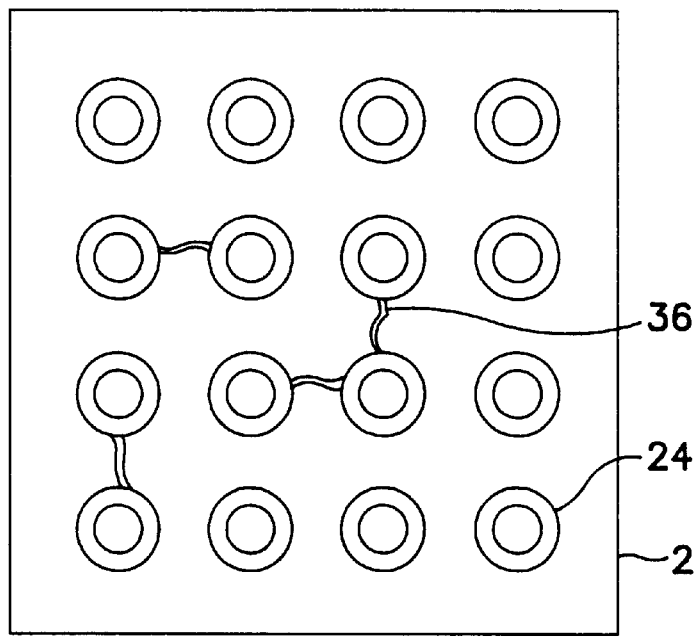
FIGS. 7A, 7B, and 7C are top views of electroplated C4's having photoresist stripping defects, such as stringers, flakes and residual photoresist, respectively.
Figure 7B:
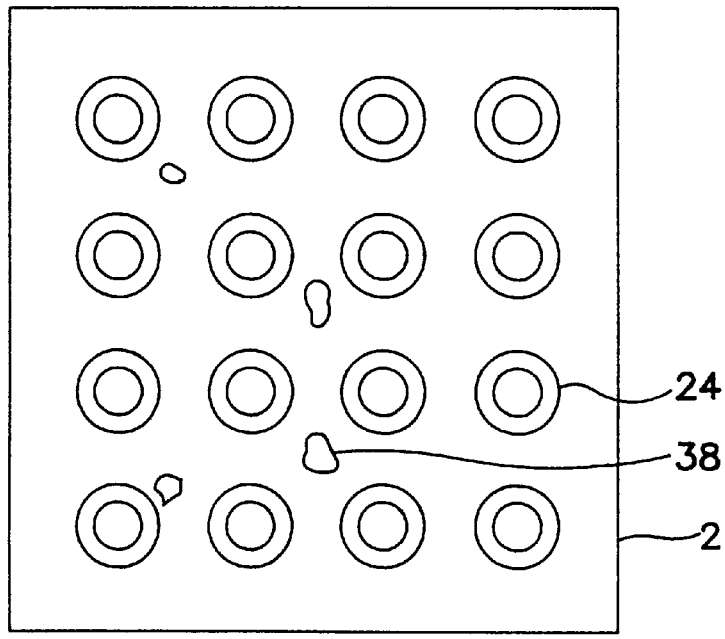
Figure 7C:
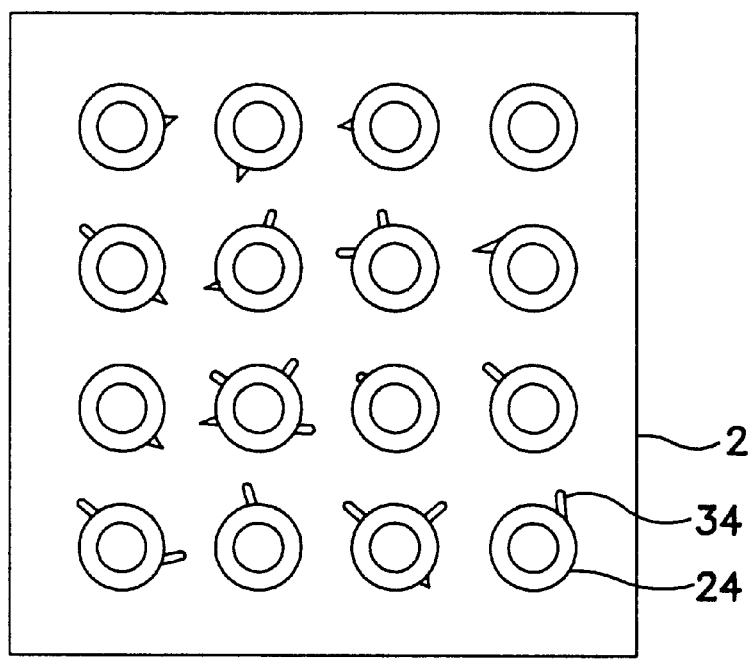
Figure 8:
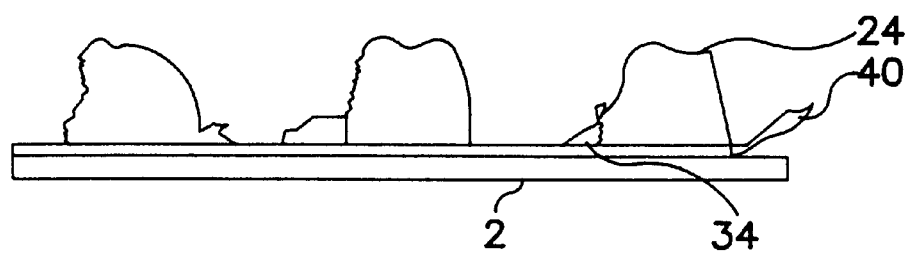
FIG. 8 is a side view of an incompletely stripped photoresist in which a harsh stripper has attacked device constituents.

Although the above described process is a remarkable improvement over conventional hydroxide processing, it can exhibit defect if not exercised at an optimized temperature, time, and level of agitation. Such defects are most prevalent on very dense patterns. Typical defects can be characterized as follows and in reference to FIGS. 7A, 7B, and 7C:

(1) Stringers 36—as shown in FIG. 7A, which are thin strings of resist between adjacent C4's 24;
(2) Flakes 38—as shown in FIG. 7B, which are small patches of unremoved resist; and
(3) Residual 34—as shown in FIG. 7C, which are small wisps of resist retained at the base of the C4's 24.

Comprehensive process windows studies on a variety of chip patterns have been explored at temperatures of 60–75° C. and strip times of 120–240 minutes. These studies showed that, on sparse patterns (<500 pads/chip), chip yields of greater than 99% could be repeatedly obtained at a process target of 70° C. and 120 minutes. At increased pattern densities (>800 pads/chip), however, complete removal is difficult to obtain. Furthermore, acceptable results cannot be obtained by further increasing the temperature or the time. Other deleterious effects, including lead/tin losses of greater than 5% and copper discoloration are routinely observed at temperatures above 75° C., times above 120 minutes, or both. It has been demonstrated that the above-mentioned chemical process can be combined with appropriate agitation to yield defect-free chips, even in the high density regions.

Figure 1:
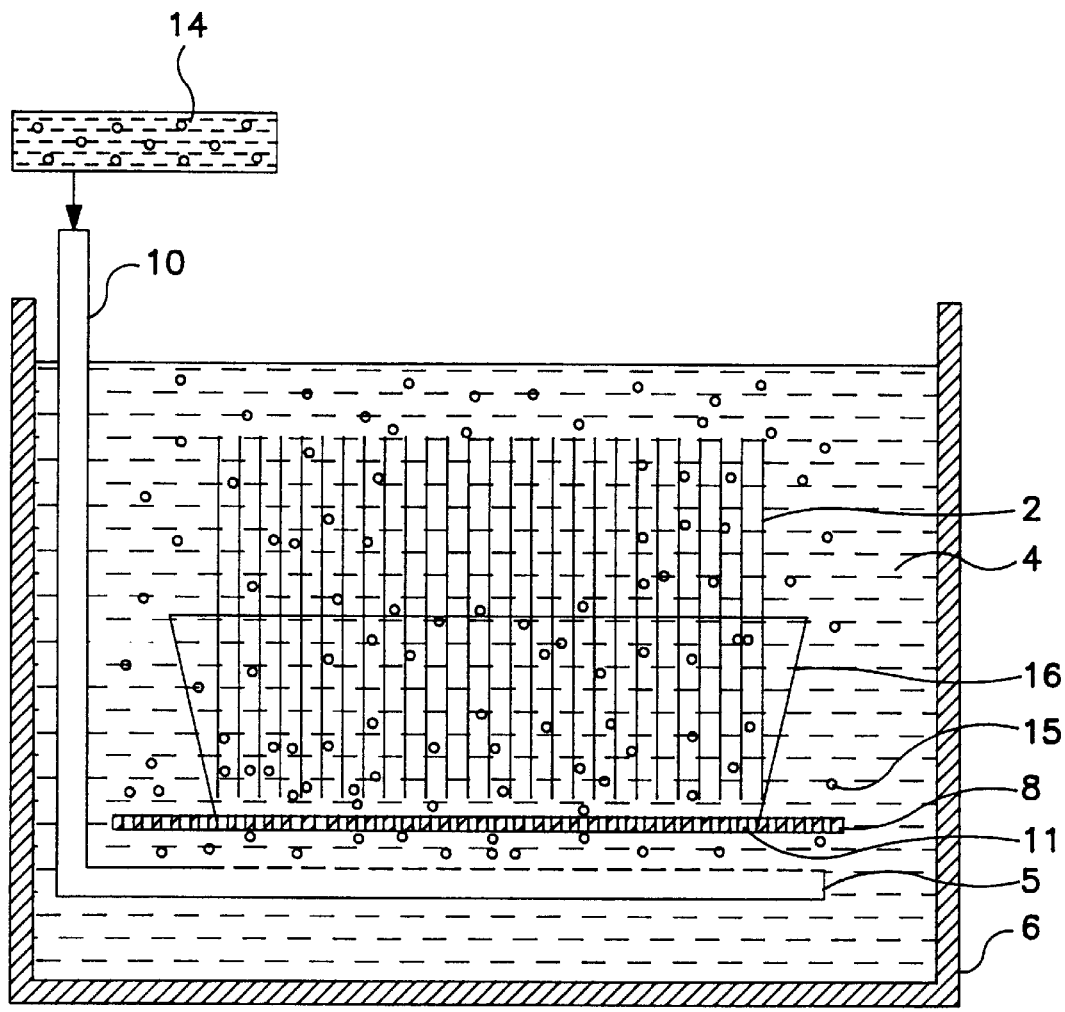
FIG. 1 is a side view of the photoresist removal apparatus according to the present invention.

In a preferred embodiment shown in FIG. 1, a wafer or substrate 2 is stripped of photoresist by immersing it in a stripping solution 4 within a strip tank 6. The photoresist is several mils thick, often about 4 mils (0.1016 mm) thick. The strip tank 6 includes a wafer boat 16 which allows placement of the wafers 2 in a vertical position. In addition, the tank 6 includes a false bottom 8 which supports the wafer boat 16. The false bottom 8 has perforations 11 which allow passage of solution therethrough.

In order to improve stripping, the stripping solution 4, when contacting the wafer 2 in the strip tank 6, is agitated by various external sources. These sources include mechanical agitation and the infusion of various liquids or gases into the stripping solution 4 in the strip tank 6.

Figure 2:
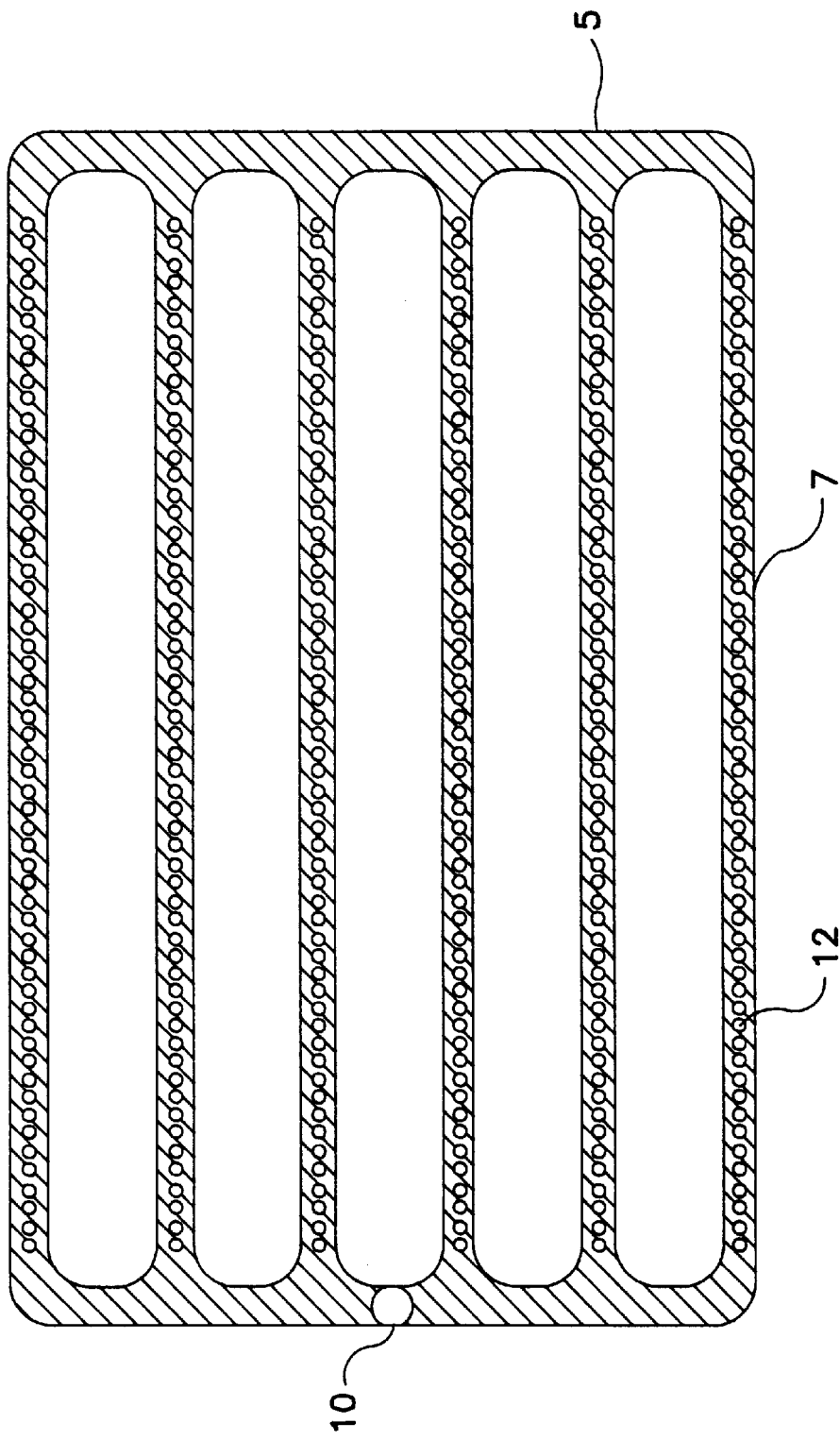
FIG. 2 is a top view of the photoresist removal apparatus shown in FIG. 1.

In a preferred embodiment of the present invention shown in FIGS. 1 and 2, the stripping solution 4 is agitated by introduction of an inert gas 14 through a pressurized tube 10 which causes aggressive bubbling in the solution 4 around the wafers 2 to be stripped. A preferred inert gas to use in the present invention is nitrogen. The bubbles 15 formed in the solution 4 cause mechanical agitation of the solution 4 near the surface of the wafers 2. The input end of the tube 10 is outside of the strip tank 6 where it is supplied with an inert gas 14. The tube 10 extends vertically into the strip tank 6 and toward the bottom of the strip tank 6 where the tube branches into an inert gas fan 5, also pressurized, having several tubes extending horizontally along the bottom of the strip tank 6 under the false bottom 8 and the wafers 2.

The inert gas fan 5 consists of an array of tubing 7, containing a series of evenly spaced pinholes 12. The tubing 7 may be stainless steel and may have a diameter of around 6.35 mm (0.25 in.). The fan 5 is situated beneath a perforated false tank bottom 8, directly under the wafer boat 16. The false bottom 8 also may be made of stainless steel. When the tubing is pressurized with the inert gas 14, the result is a constant source of bubbling within the stripping solution 4. During processing, the numerous gas bubbles 15 travel vertically between the wafers 2 and gently scrub the wafer surface.

The inert gas travels from the supply source outside of the tank 6 into the tube 10 and feeds into the inert gas fan 5 which has pinholes 12 along its top surface which allow the inert gas 14 to enter the stripping solution 4. The inert gas 14 then passes through the perforations 11 in the false bottom 8. The perforations 11 are positioned to allow uniform distribution of the bubbles 15. The bubbles 15 uniformly travel vertically and act to agitate the stripping solution 4 and strip the wafer 2.

The level of agitation can easily be adjusted by regulating the flow rate of the inert gas. This can be accomplished by varying the tubing size, hole diameter, hole spacing, and pressure exerted in the tube. For the present invention, the appropriate tubing size, hole diameter, hole spacing, and pressure were designated to provide uniform agitation throughout a full boat of wafers.

The combination of the stripping solution 4 and the inert gas 14 acts upon the wafer 2 containing the photoresist 22 and allows the photoresist 22 to be stripped off the wafer 2. This stripped wafer is substantially free of corrosion, redeposits, residual, and damage to it.

The inert gas fan arrangement has provided a unique way to robustly agitate stripping solutions for C4 plating applications, including the solution described above. The level of agitation required to successfully strip wafers cannot be easily achieved by bulk recirculation, and safety and environmental considerations strongly discourage spraying solvents. By implementing the above device, chip yields in excess of 99% have been sustained in a manufacturing environment.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A method of removing a dry photoresist layer from a silicon wafer having a metal stack and C4 solder bumps, comprising the steps of:

contacting a silicon wafer having a dry photoresist layer having a thickness of about 4 mils with a stripping solution in a strip tank at a temperature between about 50° C. and about 75° C., the photoresist layer being 60–100% by weight benzophenone, 5–10% by weight 4-methyl-4-trichloromethyl-2,5-cyclohexadien-1-one, 1–5% by weight ethyl 4-(dimethylamino)benzoate, 1–5% by weight tetramethyl succinonitrile, 1–5% by weight methyl alcohol, and less than 0.1% by weight polyol acrylate monomer, and the stripping solution being 70–80% by weight N-methyl-2-pyrrolidone, 20–30% by weight propane diol, and 25–35 grams/liter of tetramethyl ammonium hydroxide;

introducing nitrogen into the strip tank through a pressurized tube branched below the silicon wafer and having at least one hole below the silicon wafer to release the nitrogen and create bubbling to agitate the stripping solution; and removing the dry photoresist layer from the silicon wafer.

2. A method of removing a dry photoresist layer from a silicon wafer having a metal stack and C4 solder bumps, comprising the steps of:

contacting a silicon wafer having a dry photoresist layer having a thickness of about 4 mils with a stripping solution at a temperature between about 50° C. and about 75° C., the photoresist layer being 60–100% by weight benzophenone, 5–10% by weight 4-methyl-4-trichloromethyl-2,5-cyclohexadien-1-one, 1–5% by weight ethyl 4-(dimethylamino)benzoate, 1–5% by weight tetramethyl succinonitrile, 1–5% by weight methyl alcohol, and less than 0.1% by weight polyol acrylate monomer, and the stripping solution being 70–80% be weight N-methyl-2-pyrrolidone, 20–30% by weight propane diol, and 25–35 grams/liter of tetramethyl ammonium hydroxide;

agitating the stripping solution containing the silicon wafer; and removing the dry photoresist layer from the silicon wafer.

3. The method according to claim 2, wherein the stripping solution and the silicon wafer are in a strip tank and the step of agitating the stripping solution comprises introducing an inert gas into the strip tank through a pressurized tube to a create bubbling in the stripping solution, the tube having at least one hole in its surface to release the inert gas.

4. The method according to claim 3, wherein the inert gas is selected from the group consisting of nitrogen, helium, neon, argon, and carbon dioxide.

5. The method according to claim 3, wherein the inert gas is nitrogen.

6. The method according to claim 3, wherein the tube is branched below the silicon wafer and the tube releases the inert gas and causes bubbling below the silicon wafer.

7. The method according to claim 3, wherein the temperature of the stripping solution is about 60° C.

8. The method according to claim 3, wherein the temperature of the stripping solution is about 70° C.

9. A method of removing a dry photoresist layer from a silicon wafer having a metal stack and C4 solder bumps, comprising the steps of:

contacting a silicon wafer having a dry photoresist layer having a thickness of about 4 mils with a stripping solution in a strip tank at a temperature of about 70° C., the photoresist layer being 60–100% by weight benzophenone, 5–10% by weight 4-methyl-4-trichloromethyl-2,5-cyclohexadien-1-one, 1–5% by weight ethyl 4-(dimethylamino)benzoate, 1–5% by weight tetramethyl succinonitrile, 1–5% by weight methyl alcohol, and less than 0.1% by weight polyol acrylate monomer, and the stripping solution being 70–80% by weight N-methyl-2-pyrrolidone, 20–30% by weight propane diol, and 25–35 grams/liter of tetramethyl ammonium hydroxide;

introducing nitrogen into the strip tank through a pressurized tube branched below the silicon wafer and having at least one hole below the silicon wafer to release the nitrogen and create bubbling to agitate the stripping solution; and removing the dry photoresist layer from the silicon wafer.

* * * * *